INVENTOR.
William L. Price
BY
Mueller, Aichele & Rauner
ATTY'S.

INVENTOR.
William L. Price

BY

Mueller, Aichele & Rauner

ATTY'S.

United States Patent Office 3,439,414

Patented Apr. 22, 1969

3,439,414

METHOD FOR MAKING SEMICONDUCTOR STRUCTURE WITH LAYERS OF PRESELECTED RESISTIVITY AND CONDUCTIVITY TYPE

William L. Price, Scottsdale, Ariz., assignor to Motorola, Inc., Franklin Park, Ill., a corporation of Illinois Filed Jan. 3, 1967, Ser. No. 606,729

Int. Cl. H01l 5/00, 7/36

U.S. Cl. 29—580 5 Claims

ABSTRACT OF THE DISCLOSURE

An improved semiconductor structure having an isolated region of semiconductor material with predetermined electrical properties and a novel method for fabricating this structure utilizing epitaxial deposition and selective removal of material in a fewer number of steps and with improved control. The final structure has a smooth, flat face with the region protected by an electrically insulative layer.

BACKGROUND OF THE INVENTION

This invention relates to a semiconductor structure and more particularly to a structure having an electrically isolated region of semiconductor material including a layer of semiconductor material with preselected resistivity and conductivity type supported in a larger substrate of semiconductor material and a process for fabricating this novel structure.

The invention is advantageously utilized in the fabrication of monolithic integrated circuits that generally include many circuit components such as transistors, diodes, resistors, capacitors and combinations thereof that are formed in or on a substrate of semiconductor material. Some form of electrical isolation is provided about these circuit components to prevent undesired interactions that have adverse effects on the operation of the circuit. One widely used form of isolation in monolithic integrated circuits is "PN junction isolation." Another form of isolation uses an electrically insulative layer.

The former isolation, as the name implies, consists of PN junctions that are formed about each group of circuit components. These isolating PN junctions are fabricated such that each group of components is constantly surrounded by a reverse biased PN junction at least during the operation of the circuit. Generally, junctions are formed by solid state diffusions of selected impurities in predetermined locations of a substrate according to known techniques. This diffused isolation extends into the substrate to a greater depth than other formed regions and therefore, usually requires treatment of the substrate at high temperatures for an extended period of time. Epitaxial techniques of depositing doped material may also be utilized to form portions of isolating PN junctions. Even with epitaxial techniques, an additional high temperature treatment for the diffusion is required. Each high temperature treatment is detrimental to final device characteristics.

Although widely used, PN junction isolation because of the inherent nature of reverse biased junctions introduces parasitic capacitance into the operation of the integrated circuit. Also, a number of potential leakage paths between the circuit components are available through the substrate. These detrimental effects reduce the speed and dependability of integrated circuits fabricated with this type of isolation.

To overcome such detrimental aspects of PN junction isolation, monolithic integrated circuits have been fabricated in which circuit components are located in regions or islands of semiconductor material, usually single crystal, that are surrounded by an electrically insulative material, such as oxide or glass, and retained in a common substrate having a coefficient of expansion similar to the semiconductor material.

Regions may be electrically isolated before fabrication of circuit components. In this situation, after isolation, the regions are subjected to known device fabricating techniques to obtain desired transistors, diodes, resistors, and other circuit components. As an alternate, the circuit components may be fabricated first in a substrate and then the substrate processed to electrically isolate the groups of components. With this latter process, obtaining minute dimensions desired for monolithic integrated circuits is difficult and required processing of the substrate in one of the final fabricating steps increases the possibility of adversely affecting electrical characteristics of the circuits after a substantial investment in prior processing.

When circuit components are fabricated in electrically isolated regions, parasitic capacitance of the circuit and isolation between components is improved. However, the semiconductor material comprising the isolated region constitutes a limitation upon the fabrication of circuit components in that desired speed and circuit characteristics cannot be fully obtained.

It is known to deposit layers of semiconductor material on portions of semiconductor material exposed through or adjacent to a layer of silicon dioxide, for example, according to techniques described in U.S. Patent 3,243,-323 issued to W. J. Corrigan. When depositing a layer of semiconductor material with this technique having a face normal to a face of a layer of silicon dioxide, there is a tendency for a notch or depressed area to form in the semiconductor material adjacent to the silicon dioxide. Therefore, it is difficult to form a flat, smooth face over the entire deposited material.

SUMMARY OF THE INVENTION

Accordingly, it is an object of this invention to provide a novel semiconductor structure including an electrically isolated region having preselected properties and a smooth, flat face.

A further object of the invention is to reduce the cost of a semiconductor structure having an electrically isolated region with preselected properties and a smooth, flat surface.

Another object of the invention is to provide a novel process for fabricating a semiconductor structure that improves the accuracy of the dimensions and characteristics of the material within an electrically isolated region.

A feature of this invention is a semiconductor structure including an electrically isolated region with a smooth, flat face suitable for photoresist, metallization and other device processing steps and tailored layers of semiconductor material protected by a layer of electrically insulative material.

Another feature of the invention is a process for fabricating a semiconductor structure in which semiconductor material initially comprising an isolated region and a supporting substrate are etched simultaneously as one processing step.

Another feature of the invention is the substantially simultaneous deposition of the semiconductor material on an isolated region and supporting substrate by epitaxial techniques at a faster rate than with prior fabrication techniques.

A further feature of the invention is the formation of a smooth, flat face on a semiconductor structure in which semiconductor material comprising an isolated region in the structure is protected throughout a surface forming process by an electrically insulative layer that protects the surface from work damage and other contamination while maintaining the thickness of the material within the isolated region.

The invention is embodied in a semiconductor structure with an electrically isolated region of semiconductor material supported in a substrate of semiconductor material. The region of semiconductor material has a top, bottom and sides encompassed by an isolating layer and a first surface layer of electrically insulative material, the isolating layer being adjacent to the bottom and sides and the first surface layer being adjacent to the top. The first surface layer has a substantially flat and smooth surface that has a displaced area adjacent to the isolating layer. The region has a first and second layer of semiconductor material adjacent to one another at an interface. A substrate of semiconductor material is adjacent to the isolating layer, opposite the region, and has a third and fourth layer of semiconductor material adjacent to one another at an interface in a common plane with the interface of the first and second layers of semiconductor material. The fourth layer of semiconductor material has a substantially flat surface. A second surface layer of electrically insulative material is on the fourth layer of semiconductor material and has a substantially flat surface in a common plane with the surface of the first surface layer. Additional semiconductor material disposed on one of the surface layers is included in a common smooth, flat surface formed primarily of the first and second surface layers and lesser amounts of the additional semiconductor material, the fourth layer and a cross section of the first isolating layer.

The invention is also embodied in a process for fabricating a semiconductor structure with an electrically isolated region of semiconductor material supported in a substrate of semiconductor material. The process includes providing an assembly consisting of a region of semiconductor material surrounded on the bottom and sides by an isolating layer of electrically insulative material in turn supported in a substrate of semiconductor material. The assembly has a flat, smooth face including a surface of the region, a cross section of the isolating layer and a surface of the substrate. A predetermined amount of the semiconductor material of a thickness less than the total thickness of the material comprising the region is removed from the region and the substrate. A first layer of semiconductor material is deposited on the face of the region and the substrate, the deposited layer having a thickness less than the thickness of the semiconductor material removed. A first layer of an electrically insulative material is deposited on the face of the assembly and a second layer of semiconductor material deposited thereon. The face of the assembly is treated to form a flat, smooth surface primarily of the deposited first electrically insulative layer and lesser amounts of the second layer of semiconductor material, the first layer of semiconductor material and a cross section of the isolating layer.

BRIEF DESCRIPTION OF THE DRAWINGS

The invention is illustrated in the accompanying drawings in which.

DESCRIPTION OF THE PREFERRED EMBODIMENTS

Figure 1:
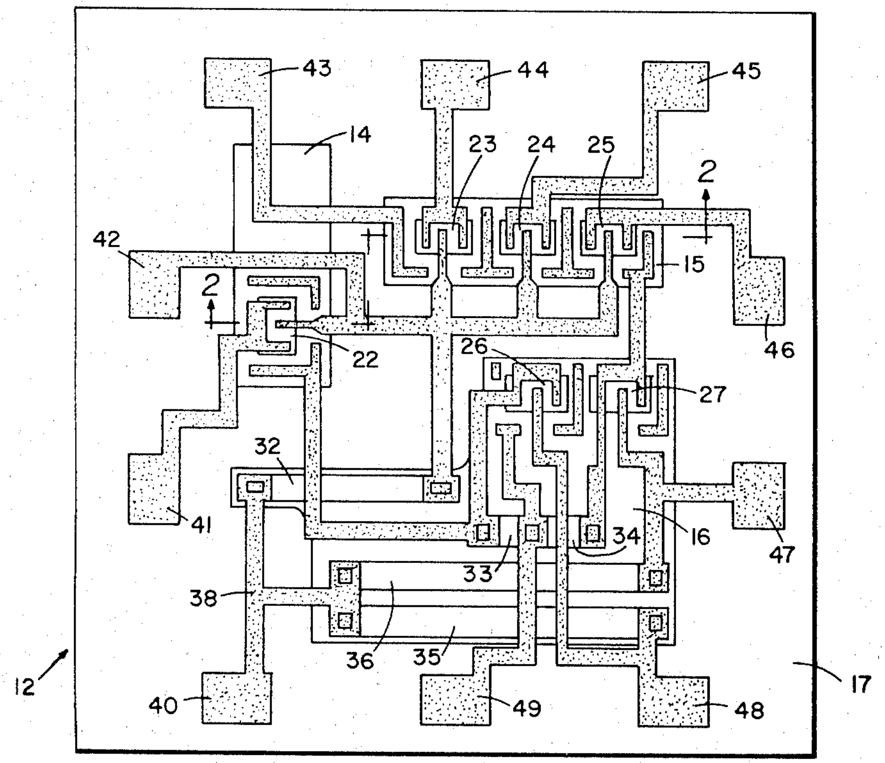
FIG. 1 is an enlarged plan view of an integrated circuit fabricated with a plurality of electrically isolated regions having a structure according to the invention formed in a common substrate.

A substrate for a semiconductor structure of the invention consists of a material having a coefficient of thermal expansion similar to the semiconductor material of regions contained therein. This substrate is beneficially rigid and capable of providing sufficient support to maintain a fixed relationship between neighboring regions. Advantageously, a face of the substrate is smooth, flat and unbroken. Also, the material selected should be capable of withstanding subsequent processing conditions such as elevated temperatures and special atmospheres. The substrate may be a crystalline material, such as silicon for example, which is advantageous when the regions comprise single crystal silicon.

A plurality of regions between may be formed on a single substrate. These regions will consist primarily of single crystal semiconductor material that is preferred for the fabrication of the circuit components. The size of each region may vary according to the size and number of components to be fabricated therein. Typically, the single crystal semiconductor material will be silicon, although other semiconductor materials may be utilized. The regions formed in the substrate will have one face exposed or juxtaposed to the surface of the substrate, with the other sides surrounded by electrically insulative material.

The substrate may be fabricated from a semiconductor material, such as polycrystalline silicon, that does not possess sufficient electrically insulative properties to adequately isolate the region. Preferably, the region will be surrounded with a good electrically insulative material such as silicon dioxide, that will effectively isolate it from the substrate and neighboring regions. This surrounding material should have good electrically insulative properties, a coefficient of expansion similar to the single crystal semiconductor material comprising the regions and be easily fabricated. This substrate structure may be obtained by one of the known fabricating techniques.

The single crystal semiconductor material with which the regions are formed is usually of a single conductivity type and resistivity. With the process of the invention, these previously determined properties do not act as a limitation on the fabrication of circuit components. Rather, the regions are tailored with an additional layer of semiconductor material to form relationships such as PN, NP, P+P, and N+N, or other combinations of resistivity and conductivity type. The invention is beneficially utilized for fabricating relationships that are difficult to form with solid state diffusion techniques.

In practicing the invention, an assembly is provided which has a region of semiconductor material that is surrounded on the bottom and sides by electrically insulative material and supported by a substrate. The region is semiconductor material and preferably single crystal. This region may have a thickness of about 25 microns or greater and have a surface area and geometry determined according to the circuit components to be fabricated therein. The substrate supporting the region and electrically insulative layer is a material with properties similar to the material comprising the region. This substrate may be the same semiconductor material as that of the region although it may be in the polycrystalline form. The surface of this substrate that is in a common plane with the exposed surface of the region is likewise exposed.

A portion of the substrate and region is removed to form a depression delineated by the electrically insulative layer that was originally about the portion of the region removed. With similar materials comprising the regions and the substrate the resulting faces, after removal of material, the substrate and the region will be in substantially a common plane.

Chemical etchants may be utilized for removing the semiconductor material. These etchants should attack the material in the region and the substrate at a substantially identical rate. Also, these etchants should not attack or attack at a slow rate the insulative layer about the region. The etchants should have a controllable rate of removal of material at a convienient operating temperature, such as room temperature or an ambient temperature. The material comprising the region and the substrate is preferably completely removed from the insulative layer projecting above the face of the assembly. One of the known gaseous or liquid etching techniques may be utilized for this removal and preferably known liquid etchants are utilized, such as for silicon a mixture of (by volume) five parts nitric acid, one part hydrofluoric acid and one part acetic acid; or 20 parts nitric acid and one part hydrofluoric acid.

Semiconductor material is then deposited in the depression and on the face of the substrate. It is a known property of semiconductor material that, under proper conditions, it will tend to propagate a compatible crystalline structure as it is deposited or grown on another layer of similar material. Therefore, the material deposited in the depressions will have the same crystalline structure as that of the remaining material of the region.

This semiconductor material may be deposited with epitaxial techniques in which the assembly is placed on a quartz slab supported on a graphite or molybdenum carrier. The assembly is positioned with the depression exposed. The carrier is inserted in a reactor having a diameter of about four inches and the assembly heated, for example, in the case of silicon to between about 1000 and 1200° C. by an induction heater. Hydrogen gas is flowed through the reactor at between about 20 and 50 liters per minute to clean the exposed surfaces of semiconductor material. A gaseous mixture of hydrogen and a gaseous compound of the semiconductor material to be deposited is then flowed through the reactor to epitaxially grow the semiconductor material in the depression and on the face of the substrate. The semiconductor material is deposited at a substantially uniform rate in the depression and on the adjacent supporting substrate. A small amount of polycrystalline material may form on the sides of the insulative material defining the depression; however, the amount that is formed in this manner is not considered detrimental to the ultimate semiconductor structure.

The deposited semiconductor material may be doped to a preselected conductivity type and resistivity by introducing one of the known dopant sources into the gaseous mixture during the epitaxial deposition of the semiconductor material. As an example, to form P type semiconductor material an impurity dopant such as boron may be utilized and for N type semiconductor material, an impurity dopant such as arsenic or phosphorous is suitable. A wide range of resistivities are available by altering the concentration of the dopant introduced into the gaseous mixture.

The deposition is continued until the predetermined thickness of semiconductor material is deposited in the depression. This material will have a substantially smooth, flat face with a slightly depressed area adjacent to the insulative layer. In a similar manner, the substrate on the opposite side of the insulative layer will have a flat face generally in a common plane with the region.

At this point in the fabrication, the insulative layer surrounding the region will project above the balance of the face of the assembly. A layer of silicon dioxide is then deposited on the face of the assembly to form an adherent layer greater than about one micron thick on the deposited layer and exposed portion of the insulative layer. The layer of silicon dioxide is preferably deposited without removing the assembly from the reactor, which is particularly beneficial in that the surface of the semiconductor material is protected from contamination. This layer may be deposited by substituting for the flow of the hydrogen and gaseous semiconductor compound a gaseous mixture of oxygen and silicon tetrachloride. This small amount of silicon dioxide is generally formed in a period of between about six and 12 minutes and has a contour substantially identical to that of the face of the assembly.

A layer of semiconductor material is then deposited on the silicon dioxide to a sufficient thickness to completely fill in the depressions adjacent to the electrically insulative layer. This thickness is usually between about one and two microns. The deposition is also advantageously performed without removing the assembly from the reactor by substituting a flow of a mixture of hydrogen and a gaseous compound of the semiconductor material for the gaseous mixture utilized for depositing the silicon dioxide.

The assembly now has a rough, uneven surface of polycrystalline material. This surface is treated to selectively remove portions of this polycrystalline material and form a smooth, flat surface on the assembly. This smooth, flat surface may be formed by polishing the wafer with known techniques. Since the majority of the surface of the assembly is comprised of silicon dioxide, which is more abrasion resistant than the deposited polycrystalline material, a substantial difference occurs in the rate of polishing when this smooth, flat surface is exposed. The majority of the surface of the assembly comprises the exposed silicon dioxide and minor portions of polycrystalline material and a cross section of the insulative layer. This surface is suitable for additional photoresist, metallization or other processing that is utilized in the fabrication of circuit components.

Figure 2:
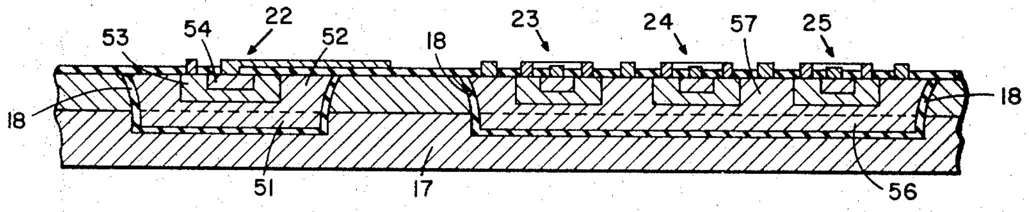
FIG. 2 is an enlarged cross-sectional view along lines 2—2 of FIG. 1.
Figure 3:
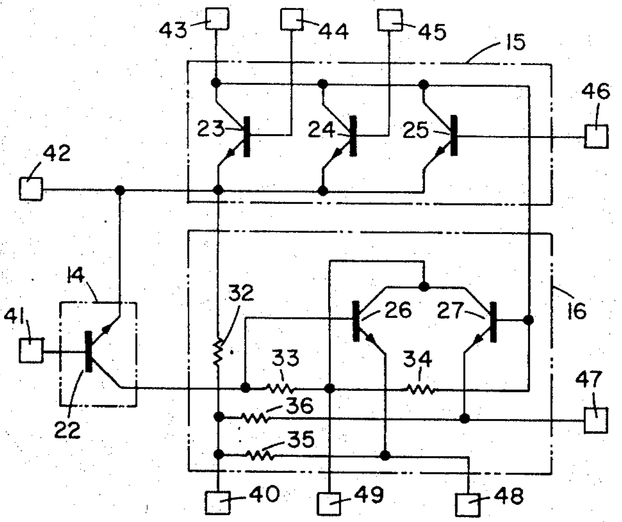
FIG. 3 is a schematic diagram of an integrated circuit formed in the monolithic structure of FIG. 1.

In FIGS. 1 and 2 of the accompanying drawings, an integrated circuit structure 12 is shown fabricated in a semiconductor structure embodying the invention. A schematic of this integrated circuit is shown in FIG. 3. Structure 12 includes three regions 14, 15, 16 of single crystal semiconductor material and are supported in a common substrate 17 and electrically isolated therefrom by an electrically insulative layer 18 (FIG. 2). This circuit is a current mode logic gate comprised of transistors 22, 23, 24, 25, 26, 27 and resistors 32, 33, 34, 35, 36. The circuit components in structure 12 are interconnected by a pattern of electrically conductive material 38. Electrical connections are made to this circuit through the surrounding bonding pads 40, 41, 42, 43, 44, 45, 46, 47, 48, 49 fabricated from metal 38.

Region 14 includes a single transistor 22 that is formed by selective diffusion techniques. A collector for transistor 22 consists of an N+ type region 51 and a contiguous N type region 52 in which a base 53 and emitter 54 of transistor 22 are formed. Transistor 22 has physical dimensions similar to those of transistors 23, 24, 25, 26, 27 because they were all formed at the same time. Even though it has similar physical dimensions and similar electrical characteristics, transistor 22 is electrically isolated within substrate 17 from transistors 23, 24, 25, 26, 27.

Transistors 23, 24, 25 are fabricated in region 15 and have a common collector consisting of a layer 56 of N+ type material and a layer 57 of N type material. The base and emitter regions of these transistors were also formed by selective diffusion techniques.

Region 16 contains the balance of the components for the integrated circuit structure. Transistors 26, 27 are NPN transistors formed by selective diffusion techniques and have structures similar to those shown in FIG. 2. Resistors 32, 33, 34, 35, 36 have been fabricated by selective diffusions into region 16 to form strips having a conductivity type opposite region 16. Contacts are then provided at opposite ends of the strips and the resistors are interconnected with other components according to the schematic of FIG. 3 by metallization 38.

Figure 4A:
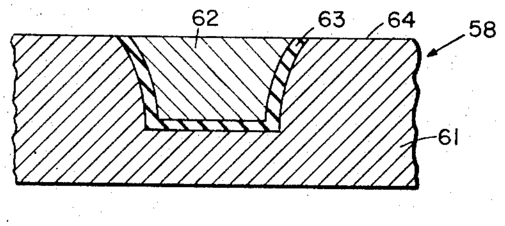
FIGS. 4A to 4D are enlarged cross-sectional views showing progressive stages of the fabrication of one of a plurality of regions included in a common substrate, each region being isolated by an electrically insulative material.

In FIGS. 4A to 4D progressive stages are shown in the fabrication of a semiconductor structure that constitutes the basic material comprising regions such as 14, 15, 16. In FIG. 4A an assembly 58 is shown which includes a region of single crystal semiconductor material 62 surrounded by a layer 63 of electrically insulative material that is supported by a substrate 61. Substrate 61 is a portion of a large wafer that includes a plurality of regions of varying size similar to region 62. Substrate 61 in combination with insulative layer 63 and region 62 forms a smooth, flat surface 64.

Figure 4B:
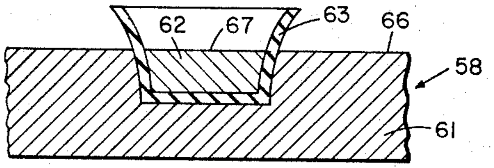

In FIG. 4B assembly 58 is shown after a portion of substrate 61 and region 62 have been removed. Substrate 61 has a face 66 in a substantially common plane with a face 67 of region 62. The removal of material was performed so that insulative layer 63 was not affected to an appreciable extent. Therefore, insulative layer 63 extends above substrate 61 and region 62 defining a depression that was formerly filled by the removed portion of region 62.

Figure 4C:
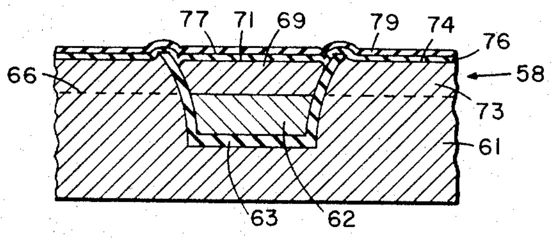

Assembly 58 is shown in FIG. 4C after a layer 69 of semiconductor material has been deposited in the depression bounded by insulative layer 63 on the remaining material of the original region 62. Layer 69 has a crystalline structure similar to that of the material of region 62 and a surface 71 that is substantially smooth and flat except for a depressed area adjacent to insulative layer 63. The thickness of this layer is intentionally less than the thickness of the material previously removed from region 62. During the deposition of layer 69, a layer 73 of about the same thickness was deposited on surface 66 of substrate 61. Layer 73 has a face 74 generally in a common plane with face 71 except for an area adjacent to layer 63.

A layer 76 of silicon dioxide is deposited on faces 74 and 71 and about the exposed surfaces of layer 63. Layer 76 has face 77 similar to faces 71 and 74 except in the area about layer 63. The combined thickness of layers 76 and 69 is selected to be less than the thickness of the material removed from region 62 and therefore, layer 63 projects above the general plane of face 77. An additional layer 79 of semiconductor material is disposed on face 77 completely filling the depressed area adjacent to layer 63. Although layer 79 has the general contour of layer 76, sufficient material is deposited to fill the depressed area above the level of face 77.

Figure 4D:
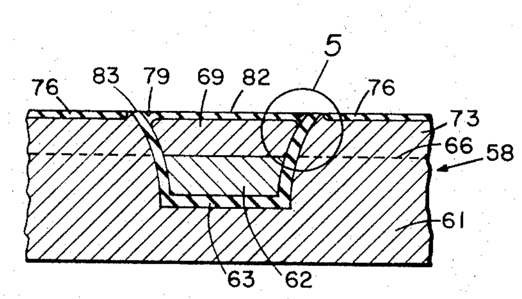

Assembly 58 is shown in FIG. 4D after the formation of a smooth, flat face 82 that includes layers 76, 73, 79 and a cross section 83 of layer 63. The semiconductor material of layer 79 is primarily in the depressed area of layer 76 adjacent to layer 63. The shaping was facilitated because layer 76 acted as a polishing stop after the removal of the major portion of the semiconductor material comprising layer 79.

Figure 5:
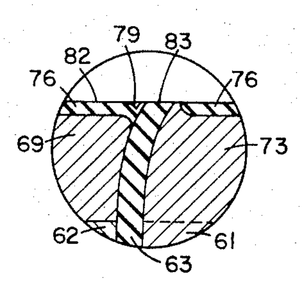
FIG. 5 is a further enlarged view of a portion of a semiconductor structure along line 5 of FIG. 4D.

The details of the depressed area of layer 76 after being filled with semiconductor material 79 and polished are clearly shown in FIG. 5. Layer 73 can be seen to extend to surface 82 adjacent to layer 63. The combined thickness of layers 73 and 76 was intentionally held to less than the thickness of the material removed from region 62 to assure the presence of layer 63 between layers 69 and 73.

The following examples illustrate specific embodiments of the invention, although it is not intended the examples restrict the scope of the invention.

*Example I*

A number of wafers about one inch in diameter and eight mils thick, each comprising a substrate of polycrystalline silicon with a plurality of electrically isolated regions of single crystal silicon were treated in a similar manner. The regions of silicon were about 25 microns deep and varied in size between about five and 20 mils square. The silicon in the regions had an N+ type conductivity and a resistivity of about .008 ohm-centimeters. The portion of the regions extending into the substrate of polycrystalline silicon were surrounded by a layer of silicon dioxide about one micron thick.

All of the regions within a wafer had a surface exposed at one common face. The surface of the supporting substrate was also exposed in this one common face. This face of each wafer was contacted with an etchant comprised of five parts nitric acid, one part hydrofluoric acid and one part acetic acid (by volume) and a thickness of silicon equal to $t$+two microns removed from the region, $t$ being a predetermined thickness of the silicon to be deposited in the region, equal in this example to about eight microns. The supporting substrate material was removed during this etching at a corresponding rate and therefore, about the same thickness of material was removed. The silicon was substantially completely removed from the silicon dioxide, leaving the layer of silicon dioxide projecting above the major portion of the face of the wafer.

The wafers were placed on a slab of quartz which rested on a graphite carrier with the faces of the wafers including the silicon dioxide layer exposed and inserted in an epitaxial reactor about four inches in diameter. Hydrogen was flowed through the reactor and the wafers heated to a temperature of about 1120° C. by induction heating. The faces of the wafers were given additional cleaning by maintaining them in the hydrogen atmosphere at this temperature for about ten minutes. A gaseous mixture of about 99.89% hydrogen, .1% $SiCl_4$ and .01% phosphene at a flow rate of about 30 liters per minute was flowed through the reactor and over the wafers and a doped epitaxial layer of N type silicon deposited upon the exposed surfaces. This flow of gases was continued until an N type layer about eight microns thick was deposited on the N+ type material of the region and a layer of corresponding thickness was deposited on the substrate.

The gas stream in the epitaxial reactor was changed to a gaseous mixture comprised of 0.5% oxygen and .2% silicon tetrachloride and 99.75% hydrogen at a flow rate of about 30 liters per minute. A layer of silicon dioxide about one micron thick was deposited on the face of the wafer. A layer of silicon was then deposited on the silicon dioxide by substituting a flow of a gaseous mixture comprising 99.8% hydrogen and .2% $SiCl_4$ through the reactor.

The wafers were removed from the reactor and mounted on a polishing block with the faces in substantially a single plane. The wafers were polished with a compound comprising primarily a fine diamond dust until a flat, smooth surface was obtained on each wafer.

The wafers were inspected and it was observed that the polished face was comprised primarily of silicon dioxide with minor portions of polycrystalline silicon. One portion of polycrystalline silicon appeared adjacent to the isolating layer of silicon dioxide at the surface thereof opposed to the region. Another portion of polycrystalline silicon appeared within the boundary of the isolating silicon dioxide and slightly spaced therefrom. A number of assemblies were sectioned and it was observed that the thickness of the new material in the region was substantially uniform from one region to another within a single wafer and that the resistivity of the new material was also uniform. The silicon dioxide deposited on the face of the region had a depressed area adjacent to the original isolating silicon dioxide. Polycrystalline material was present in this depressed area as a filler that permitted the formation of the smooth, flat surface on the wafers.

Some wafers were processed further with selective diffusion techniques to complete the formation of semiconductor devices. The devices so fabricated had electrical characteristics equal to or better than devices made by other processes.

*Example II*

The procedure of this example was the same as for Example I except that .01% diborane was substituted for the phosphene during the deposition of the single crystal silicon. A layer of P type silicon was deposited instead of N type silicon. This layer had the same beneficial characteristics as the layer of Example I.

The above description, drawings and examples show that the present invention provides a novel semiconductor structure with an electrically isolated region that includes a layer of semiconductor material having preselected resistivity and conductivity type and a process for fabricating this structure. Moreover, the final structure has a smooth, flat surface and includes layers of preselected thickness.

I claim:

1. In the fabrication of a semiconductor structure with an electrically isolated region of semiconductor material supported in a substrate of semiconductor material, a process including in combination:

providing an assembly consisting of a region of semiconductor material surrounded on the bottom and sides by an isolating layer of electrically insulative material in turn supported in a substrate of semiconductor material, the assembly having a flat, smooth face including a surface of the region, a cross section of the isolating layer, and a surface of the substrate, removing a predetermined amount of said semiconductor material from said region and substrate to a depth less than the total thickness of the material comprising said region, depositing a first layer of semiconductor material on said face of said region and substrate, said deposited layer having a thickness less than the thickness of said semiconductor material removed, depositing a first layer of an electrically insulative material on said face of said assembly, depositing a second layer of semiconductor material on said first layer of electrically insulative material, treating said face of said assembly to form a smooth, flat surface primarily of said first electrically insulative layer, and lesser amounts of said second layer of semiconductor material, said first semiconductor layer and a cross section of said isolating layer.

2. A process according to claim 1 in which said semiconductor material is removed by subjecting said assembly to a liquid chemical etchant.

3. A process according to claim 1 in which said layer of semiconductor material is deposited on said face by an epitaxial type deposition.

4. A process according to claim 1 in which said first layer of electrically insulative material comprises silicon dioxide and is deposited on said face by an epitaxial type deposition.

5. A process according to claim 1 in which said treatment to said face comprises mounting said assembly on polishing equipment and polishing said face with a fine diamond compound to form said smooth, flat surface.

References Cited

UNITED STATES PATENTS

| | | | |
|---|---|---|---|
| 3,312,879 | 4/1967 | Godejahn | 7—64 |
| 3,332,137 | 7/1967 | Kenney | 9—64 |

WILLIAM I. BROOKS, *Primary Examiner.*

U.S. Cl. X.R.

29—578; 148—175; 317—235